(12) United States Patent
Jung et al.

(10) Patent No.: US 11,437,091 B2
(45) Date of Patent: Sep. 6, 2022

(54) SRAM WITH ROBUST CHARGE-TRANSFER SENSE AMPLIFICATION

(71) Applicant: QUALCOMM Incorporated, San Diego, CA (US)

(72) Inventors: Changho Jung, San Diego, CA (US); Percy Dadabhoy, Austin, TX (US); Arun Babu Pallerla, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/008,476

(22) Filed: Aug. 31, 2020

(65) Prior Publication Data

US 2022/0068373 A1    Mar. 3, 2022

(51) Int. Cl.
 *G11C 11/419*  (2006.01)

(52) U.S. Cl.
 CPC .................................. *G11C 11/419* (2013.01)

(58) Field of Classification Search
 CPC ....... G11C 11/418; G11C 11/419; G11C 7/08; G11C 7/106; G11C 7/12; G11C 7/222
 USPC .......................................................... 365/154
 See application file for complete search history.

(56) References Cited

U.S. PATENT DOCUMENTS

| | | | | | |
|---|---|---|---|---|---|
| 5,126,974 | A | * | 6/1992 | Sasaki | G11C 11/419 327/54 |
| 5,724,292 | A | * | 3/1998 | Wada | G11C 11/419 365/207 |
| 5,850,359 | A | * | 12/1998 | Liu | G11C 7/065 365/207 |
| 5,864,511 | A | * | 1/1999 | Sato | G11C 7/12 365/189.11 |
| 9,520,165 | B1 | * | 12/2016 | Desai | G11C 7/12 |
| 9,613,685 | B1 | * | 4/2017 | Seetharaman | G11C 11/419 |
| 11,043,262 | B2 | * | 6/2021 | Madhavan | G11C 11/419 |
| 2002/0195678 | A1 | | 12/2002 | Watanabe et al. | |
| 2009/0059686 | A1 | * | 3/2009 | Sung | G11C 7/08 365/189.11 |
| 2013/0058172 | A1 | * | 3/2013 | Rao | G11C 29/026 365/189.05 |
| 2013/0094307 | A1 | * | 4/2013 | Cheng | G11C 11/419 365/191 |
| 2014/0036581 | A1 | * | 2/2014 | Agarwal | G11C 7/12 365/156 |
| 2014/0112064 | A1 | * | 4/2014 | Adams | G11C 7/12 365/154 |
| 2014/0153346 | A1 | * | 6/2014 | Roy | G11C 7/12 365/189.15 |
| 2015/0029778 | A1 | | 1/2015 | Yoon et al. | |

(Continued)

OTHER PUBLICATIONS

International Search Report and Written Opinion—PCT/US2021/047992—ISA/EPO—dated Nov. 19, 2021.

*Primary Examiner* — Sung Il Cho
(74) *Attorney, Agent, or Firm* — Qualcomm Incorporated (57) ABSTRACT

A charge-transfer transistor couples between a bit line and a sense node for a sense amplifier. During a read operation, a charge-transfer driver drives a gate voltage of the charge-transfer transistor to control whether the charge-transfer transistor conducts during a charge-transfer period. To assist the charge-transfer by the charge-transfer transistor, a first and second cross-coupled transistor are coupled between the bit line and a complement bit line.

13 Claims, 5 Drawing Sheets

(56) References Cited

U.S. PATENT DOCUMENTS

| | | | |
|---|---|---|---|
| 2015/0380079 A1 | 12/2015 | Agarwal et al. | |
| 2016/0163379 A1* | 6/2016 | Roine | G11C 7/1039 |
| | | | 365/154 |
| 2016/0247555 A1* | 8/2016 | Nguyen | G11C 11/419 |
| 2017/0221551 A1* | 8/2017 | Jung | G11C 29/026 |
| 2018/0096730 A1* | 4/2018 | Vo | G11C 7/065 |
| 2018/0166129 A1* | 6/2018 | Mehta | G06F 3/0659 |
| 2019/0108872 A1* | 4/2019 | Gupta | G11C 11/419 |
| 2019/0355397 A1* | 11/2019 | Ishizu | H01L 27/1225 |
| 2019/0371413 A1* | 12/2019 | Okabe | G11C 16/16 |

* cited by examiner

SRAM WITH ROBUST CHARGE-TRANSFER SENSE AMPLIFICATION

TECHNICAL FIELD

This application relates to memories, and more particularly to a low-power memory with charge-transfer sense amplification.

BACKGROUND

In a conventional static random-access memory (SRAM), a bit line voltage difference during a read operation is not full rail but instead equals a fraction of the power supply voltage. For example, if the power supply voltage is one volt, the voltage difference may be just 100 millivolts or less. To respond to this relatively small voltage difference and make a bit decision as to what was stored in the bitcell, a typical sense amplifier requires a relatively large amount of gain and thus does not fit within the column pitch such that each sense amplifier is multiplexed across a multiplexed group of columns.

Accordingly, there is a need in the art for SRAMs with improved density.

SUMMARY

In accordance with a first aspect of the disclosure, a memory is provided that includes: a bit line; a complement bit line; a sense amplifier having a first logic gate cross-coupled with a second logic gate, the first logic gate having an input connected to a sense node, and the second logic gate having an input connected to a complement sense node; a first charge-transfer transistor connected between the bit line and the sense node; a second charge-transfer transistor connected between the complement bit line and the complement sense node; a first cross-coupled transistor having a drain connected to the bit line and a gate connected to the complement bit line; and a second cross-coupled transistor having a drain connected to the complement bit line and a gate connected to the bit line.

In accordance with a second aspect of the disclosure, a method for sensing a bit stored by a bitcell is provided that includes: pre-charging a bit line and a complement bit line to a power supply voltage while discharging a sense node and a complement sense node; coupling the bit line and the complement bit line to the bitcell to partially discharge the complement bit line responsive to a binary value of the bit stored by the bitcell; conducting charge through a cross-coupled transistor having a gate connected to the complement bit line and a drain connected to the bit line to substantially maintain a charge of the bit line at the power supply voltage; during a charge-transfer period, transferring charge from the bit line through a charge-transfer transistor to the sense node to develop a sense node voltage difference between the sense node and a complement sense node that is greater than a bit line voltage difference between the complement bit line and the bit line; and sensing a binary value of the bit responsive to the sense node voltage difference In accordance with a third aspect of the disclosure, a memory is provided that includes: a bit line; a complement bit line; a bitcell configured to store a bit; a first cross-coupled transistor having a gate connected to the complement bit line and a drain connected to the bit line; a sense amplifier having a sense node; a first charge-transfer transistor coupled between the bit line and the sense node; and a charge-transfer driver configured to charge a gate of the first charge-transfer transistor to a gate voltage during a charge-transfer period to cause the first charge-transfer transistor to conduct responsive to the bit being equal to a first binary value and to cause the first charge-transfer transistor to remain off responsive to the bit being equal to a complement of the first binary value.

These and additional advantages may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A memory such as an SRAM is provided with a plurality of bitcells arranged according to rows and columns. Each column has a bit line pair formed by a true bit line and a complement bit line. Each row has a word line. At each row and column intersection, there is a corresponding one of the bitcells. Each column includes its own sense amplifier that latches a bit decision during a read operation to one of its bitcells. In a read operation, the word line to the accessed row is asserted such that each column's sense amplifier latches a bit decision from the column's bitcell that is shared with the accessed row.

To improve density and power efficiency for each column, a sense amplifier is disclosed that includes a true sense node that couples to the true bit line through a first charge-transfer transistor. For brevity, the true bit line is referred to simply as the bit line in the following discussion. Similarly, the sense amplifier includes a complement sense node that couples to the complement bit line through a second charge-transfer transistor. A source for each charge-transfer transistor is tied to the corresponding bit line whereas its drain is tied to the corresponding sense node. Although it is conventional for a sense amplifier to couple to a bit line through a column multiplexer transistor, note that a conventional column multiplexer transistor is controlled as a switch such that it is fully on during the read operation while the sense node is coupled to the bit line.

In contrast to such conventional fully-on operation, the gate for each charge-transfer transistor is charged to a gate voltage by a charge-transfer driver during a charge-transfer period in the read operation that causes the charge-transfer transistor to conduct for only one polarity of the stored binary value in the accessed bitcell. Prior to an assertion of a word line voltage during a read operation, each bit line is charged to a pre-charged voltage while each charge-transfer transistor is maintained off. The word line voltage is then asserted to couple the bitcell to the pre-charged bit lines while the charge-transfer transistors are still off. The bitcell will then charge one of the pre-charged bit lines to a bitcell-effected voltage that depends upon the binary content for the bitcell.

The surprising result is that the charge-transfer depends upon the binary state stored by the bitcell. If this binary state equals a first binary value, the first charge-transfer transistor conducts to change the sense node voltage from its default value. A second charge-transfer transistor does not initially conduct during the charge-transfer period in response to this first binary value. But if the binary state equals a second binary value (the complement of the first binary value), the first charge-transfer transistor does not initially conduct charge so that the sense node voltage stays at its default value. Instead, it is the second charge-transfer transistor that initially conducts in response to this second binary value. Note that the capacitance of each sense node is generally smaller than the corresponding bit line capacitance. The conduction of charge by a charge-transfer transistor will thus quickly charge the corresponding sense node voltage from its default state to substantially equal the pre-charged bit line voltage. The resulting charge-transfer by the charge-transfer transistor thus functions to amplify the bit line difference voltage in substantially a full rail fashion. In a conventional SRAM, the sense amplifier must be relatively sensitive to respond to the bit line voltage difference across the bit line pair. In sharp contrast, a simple inverter may be used herein to sense a sense node voltage since it will widely swing from its default voltage due to the amplification provided by the charge-transfer function.

Note that the previous discussion is generic as to the polarity of the charge-transfer transistor. It may be either a p-type metal-oxide semiconductor (PMOS) charge-transfer transistor or an n-type metal-oxide semiconductor (NMOS) charge-transfer transistor. In both cases, the source is tied to the corresponding bit line whereas the drain is tied to the corresponding sense node. But the polarities are reversed with respect to this PMOS and NMOS implementations. In a PMOS charge-transfer transistor implementation, the bit-line pair is pre-charged to the power supply voltage whereas the default voltage for the sense node pair is ground. But in an NMOS charge-transfer transistor implementation, the bit line pair is pre-charged by being grounded whereas the default voltage for the sense node pair would equal the power supply voltage. The following discussion will focus on a PMOS charge-transfer implementation followed by discussion of an NMOS charge-transfer implementation.

In a memory having PMOS charge-transfer transistors, the bit line pair is pre-charged to the power supply voltage VDD before the word line is fired. The sense node pair is discharged to ground in a default (pre-charged) state while the sense node pair is isolated from the pre-charged bit line pair through the pair of PMOS charge-transfer transistors. With the word line asserted, the bitcell can then partially discharge one of the bit lines in the bit line pair responsive to a stored binary value in the bitcell.

Figure 1:
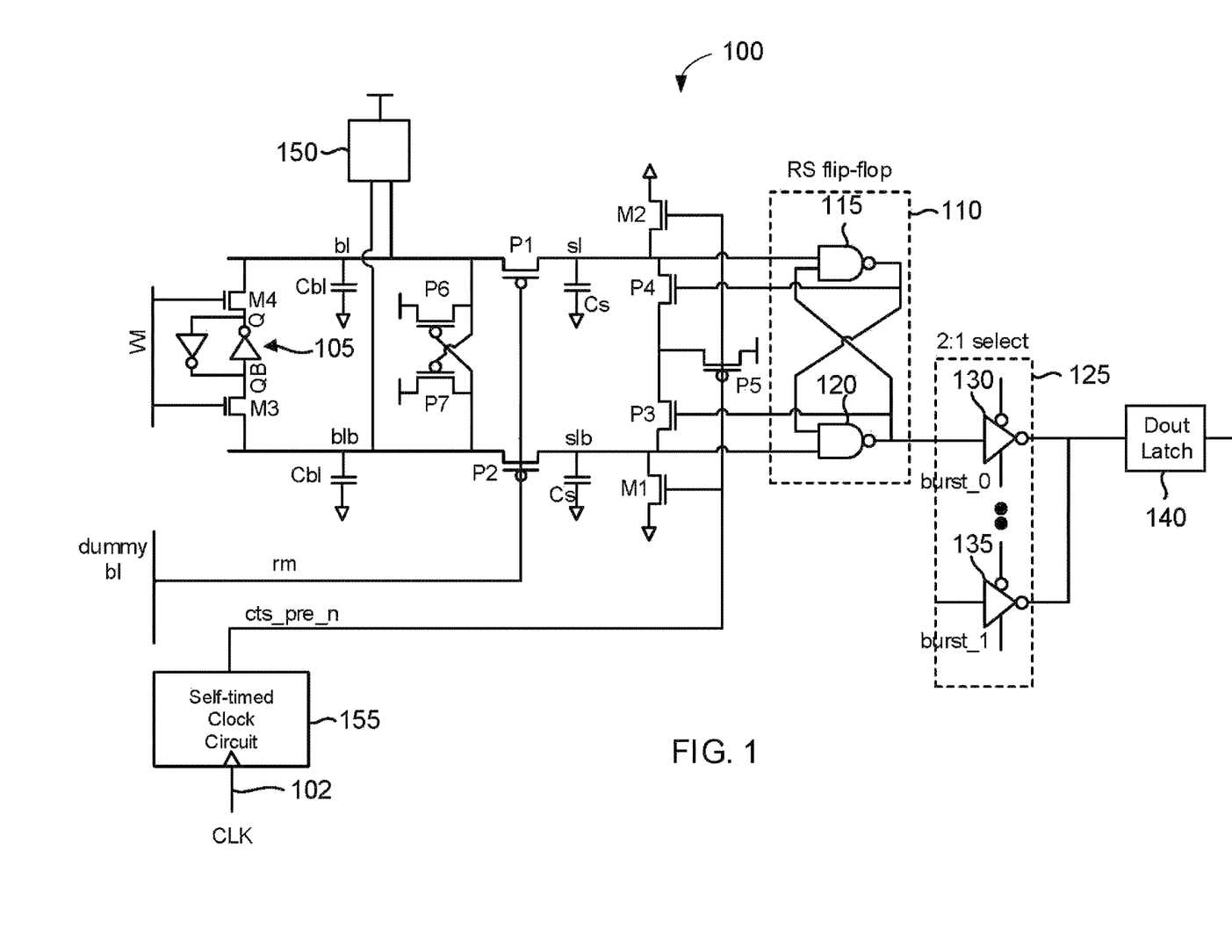
FIG. 1 illustrates a charge-transfer SRAM including a pair of PMOS cross-coupled transistors in accordance with an aspect of the disclosure.

An example charge-transfer SRAM 100 is shown in FIG. 1. A bit line pair of a bit line bl and a complement bit line blb traverse a first column. A bitcell 105 lies at an intersection of the first column and a word line wl. Bitcell 105 includes a pair of cross-coupled inverters. The output node of a first one of the inverters is the true (Q) output node for bitcell 105. This output node couples to the bit line bl through an NMOS access transistor M4. Similarly, the output node of a remaining second one of the inverters is the complement (QB) output node for bitcell 105 that couples to the complement bit line blb through an NMOS access transistor M3. The word line wl couples to the gates of the access transistors M3 and M4 so that the Q and QB nodes drive their respective bit lines during a word line assertion period.

SRAM 100 includes a second column having a bitcell at its intersection with word line wl. Since the second column is a repeat of the structure in the first column, the details for the second column are not shown in FIG. 1 for illustration clarity. The two columns are multiplexed through a column multiplexer 125. Should the read operation (whether random or burst mode) be directed to bitcell 105, column multiplexer 125 selects for a sense amplifier output from a sense amplifier 110 for the first column. For example, column multiplexer 125 may include a tri-state buffer 130 for the first column and a tri-state buffer 135 for the second column. The tri-state buffer for the un-selected column is tri-stated to form the selection in column multiplexer 125. The output of column multiplexer 125 is latched in a data output latch 140.

Prior to the word line assertion during a read operation, bit lines bl and blb were pre-charged to the power supply voltage by a bit line pre-charge circuit 150. Such pre-charging of the bit lines is conventional and thus the details for bit line pre-charge circuit 150 are not illustrated in FIG. 1. The timing of various actions such as the pre-charging of the bit lines and the pulse width for the word line assertion during a read operation are controlled by a self-timed clock circuit 155 as triggered by memory clock signal 102. The timing of these actions during a read operation is conventional. Prior to the word line assertion, bit lines bl and blb were pre-charged to the power supply voltage by bit line pre-charge circuit 150. Following the bit line pre-charging, bit line pre-charge circuit 150 floats the bit lines. Bit line bl couples to a corresponding sense node sl for sense amplifier 110 through a PMOS charge-transfer transistor P1. Similarly, complement bit line blb couples to a corresponding complement sense node slb through a PMOS charge-transfer transistor P2. Prior to the word line assertion, a charge-transfer read multiplexer (rm) signal that drives the gate of the charge-transfer transistors is charged to the power supply voltage by a charge-transfer driver such as a dummy bit line (bl) to prevent any charge transfer to the sense nodes. At or around the same time, self-timed clock circuit 155 charges a sense node pre-charge signal (cts_pre_n) to a power supply voltage. The charged cts_pre_n signal drives the gates of an NMOS transistor M1 and an NMOS transistor M2. The sources of transistors M1 and M2 are tied to ground whereas their drains are tied to complement sense node slb and sense node sl, respectively. The assertion of the cts_pre_n signal will thus discharge both the sense node sl and the complement sense node slb for the first column since both transistors M1 and M2 are switched on to couple their respective bit lines to ground. As noted earlier, the second column has the same structure as shown for the first column.

During the word line assertion period in a read operation, a switching on of the access transistors M4 and M3 by the assertion of the word line voltage causes one of the bit lines bl or blb to discharge slightly from its pre-charged state depending upon the binary content stored in bitcell 105. This slight bit line discharge is amplified by the charge-transfer period during which charge-transfer transistors P1 and P2 are switched on as follows. The charge-transfer period is triggered by the discharge of the charge-transfer rm signal. This discharge of the charge-transfer rm signal may begin while the word line voltage is still asserted. The discharge of the charge-transfer rm signal may end after the word line voltage has been discharged. The discharge of the charge-transfer rm signal has some slope to it. One way to relatively slowly discharge the charge-transfer rm signal is to form the signal using a small inverter that functions as the charge-transfer driver. Due to its relatively small size, the inverter would drop the gate voltage of the charge-transfer transistors relatively slowly during the charge-transfer period. As an alternative, the dummy bit line may be used to function as the charge-transfer driver to form the charge-transfer rm signal. As known in the SRAM arts, a dummy bit line is used to model when the bit line voltage has developed sufficiently so that the sense-enable period should be started. Since the dummy bit line models the capacitance of the bit line, the dummy bit line discharges from a pre-charged state to a threshold voltage at approximately the same rate that the bit line discharges from the power supply voltage to the bit line voltage difference.

Due to this less-than-instantaneous discharge of the charge-transfer rm signal, the charge-transfer rm signal will discharge such that the source-to-gate voltage for the charge-transfer transistor having its source tied to the fully-charged bit line will satisfy its threshold voltage but will not satisfy the threshold voltage for the charge-transfer transistor having its source tied to the partially-discharged bit line. The charge-transfer transistor for the fully-charged bit line will thus conduct charge to its sense node prior to when the other charge-transfer transistor conducts charge from the partially-discharged bit line. For example, suppose that bit line bl is the fully-charged bit line such that charge-transfer transistor P1 begins conducting a current I before charge-transfer transistor P2 conducts. Since the capacitance Cs of the sense node sl is relatively small as compared to the bit line capacitance Cbl, the current I will relatively quickly charge sense node sl from ground towards the power supply voltage. The remaining complement sense node slb would then remain discharged during an initial portion of the sense transfer period. A sense node voltage difference between the sense node sl and the complement sense node slb is thus amplified by the charge-transfer process as compared to the bit line voltage difference across the bit line pair to result in a sense node voltage difference that is nearly full rail.

Sense amplifier 110 includes a pair of cross-coupled logic gates such as implemented through a NAND gate 115 that is cross coupled with a NAND gate 120. Sense node sl is connected to an input of NAND gate 115. Similarly, complement sense node slb connects to an input of NAND gate 120. The pre-charging to zero volts of the sense nodes causes both outputs of NAND gates 115 and 120 to be asserted high to the power supply voltage. The output of NAND gate 120 also forms an output terminal for the first column. The corresponding NAND gate in the second column (not illustrated) forms an output terminal for the second column. The capacitance of the sense nodes as conceptually represented by capacitors Cs is relatively small as compared to the bit line capacitance as conceptually represented by capacitors Cbl. The brief amount of time in which charge-transfer transistor P1 begins conducting before charge-transfer transistor P2 conducts thus causes a significant increase in the voltage of sense node sl as compared to sense node slb. This increase in voltage exceeds the threshold voltage for NAND gate 115 such that its output is discharged to zero. The zero output of NAND gate 115 reinforces the binary high output of NAND gate 120 so that the binary one value stored in bitcell 105 is latched in sense amplifier 110.

Although the bit line capacitance is generally larger than the sense node capacitance, note that the bit line capacitance will diminish as the number of word lines for each column is reduced. But the charge transfer amplification during the charge-transfer period is proportional to the ratio of the bit line capacitance to the sense node capacitance. As the bit line capacitance is reduced, the charge-transfer amplification is reduced accordingly. The reduction in bit line capacitance may thus reduce the charging of a sense node voltage during the charge-transfer period such that the sense node voltage does not satisfy a threshold voltage in the sense amplifier 110. Sense amplifier 110 may then incorrectly sense the binary value of bitcell 105. In addition, leakage in bitcell 105 may reduce the bit line voltage difference that develops across the bit line pair during the word line assertion period, particularly as the word line assertion period is increased. As discussed earlier, the bit line voltage difference may be relatively small (e.g., 100 mV) such that leakage in bitcell 105 becomes problematic. A reduced bit line capacitance and/or the bitcell leakage may thus produce an error during the read operation by sense amplifier 110. To provide a more robust charge-transfer, a PMOS transistor P6 is cross-coupled with a PMOS transistor P7 across the bit line pair. Cross-coupled transistors P6 and P7 both have their source connected to the power supply node for the power supply voltage. A drain of transistor P6 connects to the bit line bl whereas its gate connects to the complement bit line blb. Similarly, the drain of transistor P7 connects to the complement bit line blb whereas its gate connects to the bit line bl.

Due to the cross-coupling of transistors P6 and P7, the partial discharge of one of the bit lines during a read operation will function to support the charging of the remaining bit line. For example, suppose that bitcell 105 stores a binary one such that the complement bit line blb partially discharges during the word line assertion portion of a read operation. Ideally, the bit line bl would remain charged to the power supply voltage during the word line assertion period. However, even in the presence of leakage such that the bit line bl voltage decreases below the power supply voltage, this decrease will typically be less than the partial discharge of the complement bit line blb. As compared to transistor P7, the reduced gate voltage for transistor P6 causes transistor P6 to switch on more than transistor P7 such that transistor P6 conducts charge to keep the bit line bl substantially charged to the power supply voltage during the word line assertion period.

The cross-coupling of transistors P6 and P7 also functions to support the non-discharged bit line during the charge-transfer period. For example, suppose that bitcell 105 is storing a binary zero such that it is the complement bit line blb that is the non-discharged bit line. As the charge-transfer rm signal discharges to ground, the source-to-gate voltage for charge-transfer transistor P2 will satisfy its threshold voltage while the charge-transfer transistor P1 remains off. Charge-transfer transistor P2 will thus begin to conduct charge during the charge-transfer period. If the bit line capacitance is not substantially greater than the sense node capacitance, the charge transfer from the complement bit line voltage blb could drop may not be sufficient to charge the complement sense node voltage above the threshold voltage of sense amplifier 110 to sense the binary zero value of bitcell 105. But even though the complement bit line voltage will discharge from the power supply voltage during the charge-transfer period due to this charge transfer, the complement bit line voltage will still tend to be higher than the partial discharge of the bit line bl voltage. Transistor P7 will thus be switched on to a greater degree as compared to transistor P6 to substantially maintain the charging of the complement bit line blb to the power supply voltage despite a reduced ratio of the bit line capacitance to sense node capacitance.

To assist the latching within sense amplifier 110, the sense node pre-charge signal cts_pre_n drives a gate of a PMOS transistor P5 having its source tied to a power supply node for the power supply voltage. The drain of transistor P5 connects to the sources of a pair of PMOS transistors P4 and P3. The drain of transistor P4 is tied to the sense node sl whereas the drain of transistor P3 is tied to the complement sense node slb. The output of NAND gate 115 drives the gate of transistor P4. Similarly, the output of NAND gate 120 drives the gate of transistor P3. Suppose that the output of NAND gate 115 is low due to the sense node sl voltage being charged above the threshold voltage of NAND gate 115 during a read operation. This low output from NAND gate 115 switches on transistor P4 to reinforce the charged state of sense node sl, which in turn reinforces the zero output for NAND gate 115. Conversely, suppose that the output of NAND gate 120 is low following a sense enable period due to the charging of the complement sense node slb above the threshold voltage of NAND gate 120. Transistor P3 would then be switched on. The switching on of transistor P3 reinforces the charged state of complement sense node slb, which in turn reinforces the zero output of NAND gate 120. In this fashion, the latching of the sensed bit in sense amplifier 110 is strengthened or reinforced.

Figure 2:
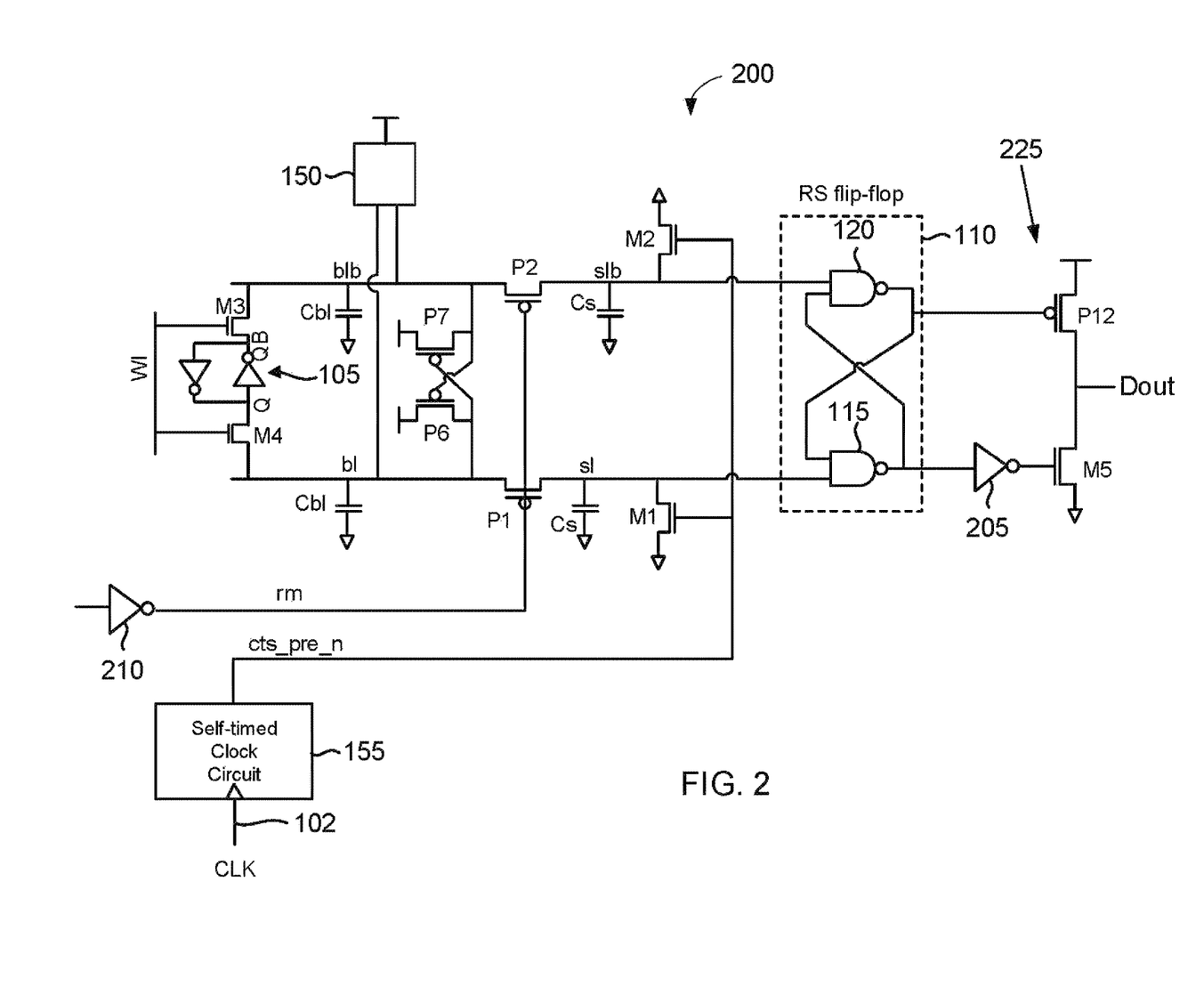
FIG. 2 illustrates a charge-transfer SRAM including a pair of PMOS cross-coupled transistors in accordance with an aspect of the disclosure.

The cross-coupling of transistors P6 and P7 may sufficiently support the charging of the non-discharged bit line such that transistors P3, P4, and P5 may be eliminated as shown for a charge-transfer SRAM 200 of FIG. 2. SRAM 200 is arranged as discussed with regard to SRAM 100 but for the omission of transistors P3, P4, and P5. In addition, the arrangement of bit lines bl and blb are reversed in FIG. 2 as compared to FIG. 1. Sense amplifier 110 functions to latch the sense binary value from bitcell 105 without the support of transistors P3, P4 and P5 due to the support of the charge of the non-discharged bit line in the bit line pair by cross-coupled transistors P6 and P7. In SRAM 200, the charge-transfer driver is formed by an inverter 210. An output buffer 225 buffers an output from sense amplifier 110. Output buffer 225 includes an inverter 205 that inverts the output from NAND gate 115. The output of inverter 205 drives a gate of an NMOS transistor M5 having a source connected to ground and a drain forming an output node for the data output signal Dout. The data output signal will thus be discharged by transistor M5 in response to the output of NAND gate 115 being charged to the power supply voltage. Output buffer 225 also includes a PMOS transistor P12 having a source connected to the power supply node and a drain connected to the drain of transistor M5. The data output signal will thus be charged to the power supply voltage in response to the output of NAND gate 120 being discharged to ground.

Figure 3:
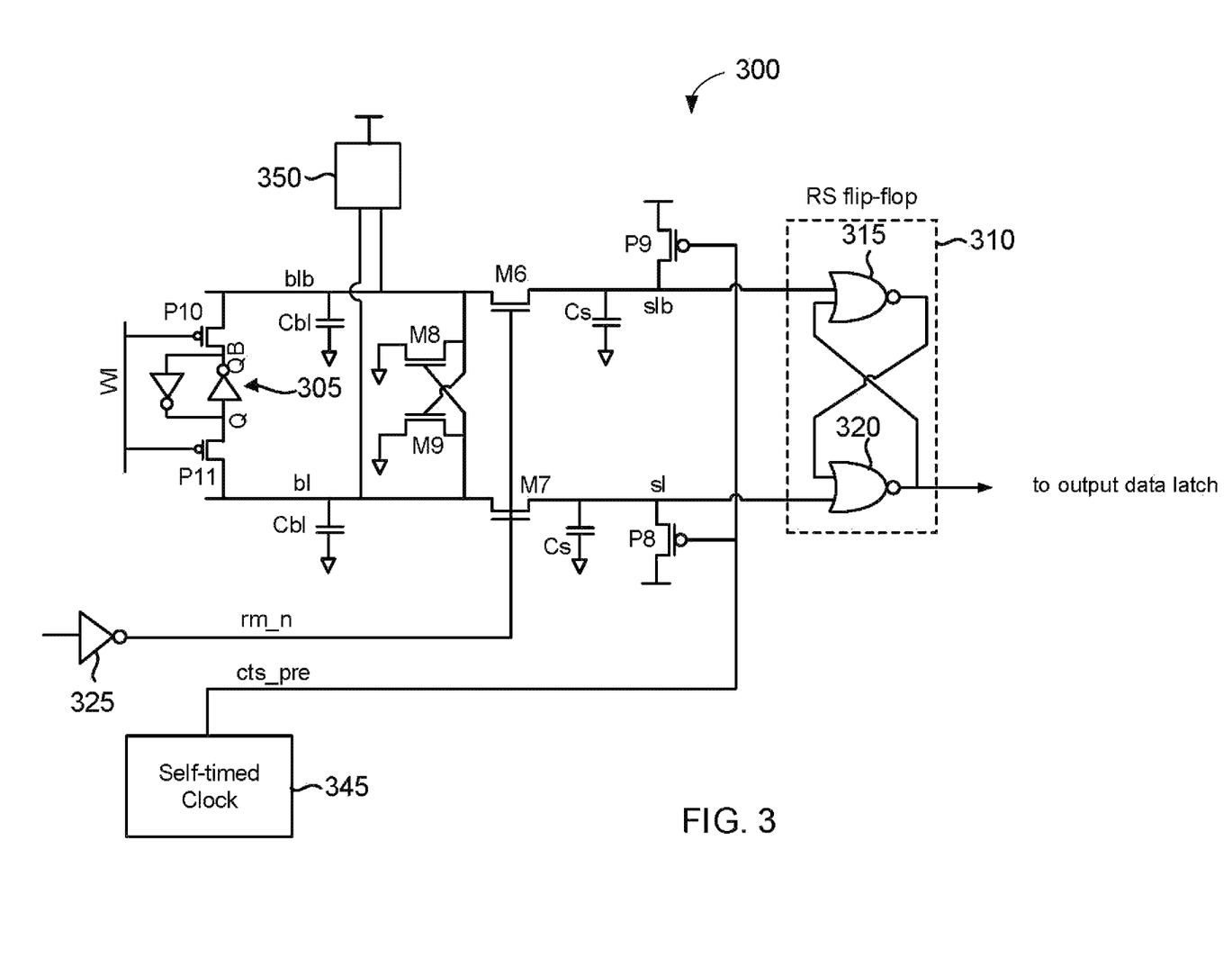
FIG. 3 illustrates a charge-transfer SRAM including a pair of NMOS cross-coupled transistors in accordance with an aspect of the disclosure.

As discussed previously, the charge-transfer transistors may be NMOS transistors in alternative implementations. An example NMOS-based charge-transfer SRAM 300 is shown in FIG. 3. PMOS charge-transfer transistors P1 and P2 are replaced by NMOS charge-transfer transistors M7 and M6, respectively. In such an NMOS charge-transfer implementation, the bit lines are pre-charged by being discharged to ground. Conversely, the sense nodes are pre-charged by being charged to the power supply voltage. A bitcell 305 couples to the bit line bl through a PMOS access transistor P11 and couples to the complement bit line blb through a PMOS access transistor P10. The word line Wl is thus asserted by being discharged during the word line assertion period. The default state of the word line Wl would then be charged to the power supply voltage to maintain the access transistors P10 and P11 off outside of the word line assertion period. A pre-charge circuit 350 functions to discharge the bit lines prior to the word line assertion period.

A self-timed clock circuit 345 controls a charge-transfer pre-charge signal cts_pre to control the pre-charging of the sense nodes. Prior to the word line assertion period, self-timed clock circuit 345 discharges the cts_pre signal to switch on a pair of PMOS transistors P8 and P9 that both have their source connected to the power supply node. A drain of transistor P9 connects to the complement sense node slb. Similarly, a drain of transistor P8 connects to the sense node sl. The switching on of transistors P8 and P9 thus pre-charges the sense nodes to the power supply voltage. Given this pre-charged state of the sense nodes, a sense amplifier 310 may be formed by a cross-coupled pair of NOR gates 315 and 320. NOR gate 315 has an input connected to the complement sense node slb and an output connected to an input of NOR gate 320. Similarly, NOR gate 320 has an input connected to the sense node sl and an output connected to an input of NOR gate 315. An output of NOR gate 320 drivers a data output latch (not illustrated) analogously as discussed with regard to SRAM 100.

During the word line assertion period, one of the bit lines will be partially-charged from ground toward the power supply voltage depending upon the binary value stored in bitcell 305. For example, if bitcell 305 is storing a binary zero, it is the complement bit line blb that will be partially charged during the word line assertion period. Conversely, if bitcell 305 is storing a binary one, it is the bit line bl that is partially charged during the word line assertion period. Depending upon the binary value stored in bitcell 305, it may thus be seen that one of the bit lines will be partially charged whereas the other one of the bit lines will be discharged. During the charge-transfer period, an active-low charge-transfer read multiplexer (rm n) signal such as driven by an inverter 325 controls the charging of the charge-transfer rm n signal to the power supply voltage. This charging has some slope to it such as produced by a relatively-small size for inverter 325. The drains for charge-transfer transistors M6 and M7 are both charged to the power supply voltage from the pre-charging of the sense nodes. The charge-transfer transistor having its source connected to the fully-discharged one of the bit lines will thus tend to turn on more quickly as compared to the charge-transfer transistor having its source connected to the partially-charged one of the bit lines.

Should the bit line capacitance be significantly larger than the sense node capacitance, the sense node connected to the charge-transfer transistor that in turn is connected to the fully-discharged one of the bit lines will discharge substantially to ground due to the charge amplification of the charge-transfer. But as the bit line capacitance drops, this charge amplification may not be sufficient for a successful sensing of the binary value of bitcell 305 by sense amplifier 310. To enhance the charge amplification, a pair of NMOS transistors M8 and M9 are cross-coupled between the bit lines bl and blb. The source of transistor M8 and the source of transistor M9 are both connected to ground. The drain of transistor M8 connects to the complement bit line blb whereas its gate connects to the bit line bl. Similarly, the drain of transistor M9 connects to the bit line bl whereas its gate connects to the complement bit line blb. Depending upon which one of the bit lines is the partially-charged bit line, the cross-coupled transistor for the remaining discharged one of the bit lines will tend to switch on during the word line assertion period to keep the discharged one of the bit lines fully discharged. In this fashion, any conduction in bitcell 305 that would tend to charge the discharged one of the bit lines is addressed. In addition, the cross-coupling of transistors M8 and M9 assist the charge-transfer amplification analogously as discussed for transistors P6 and P7.

Figure 4:
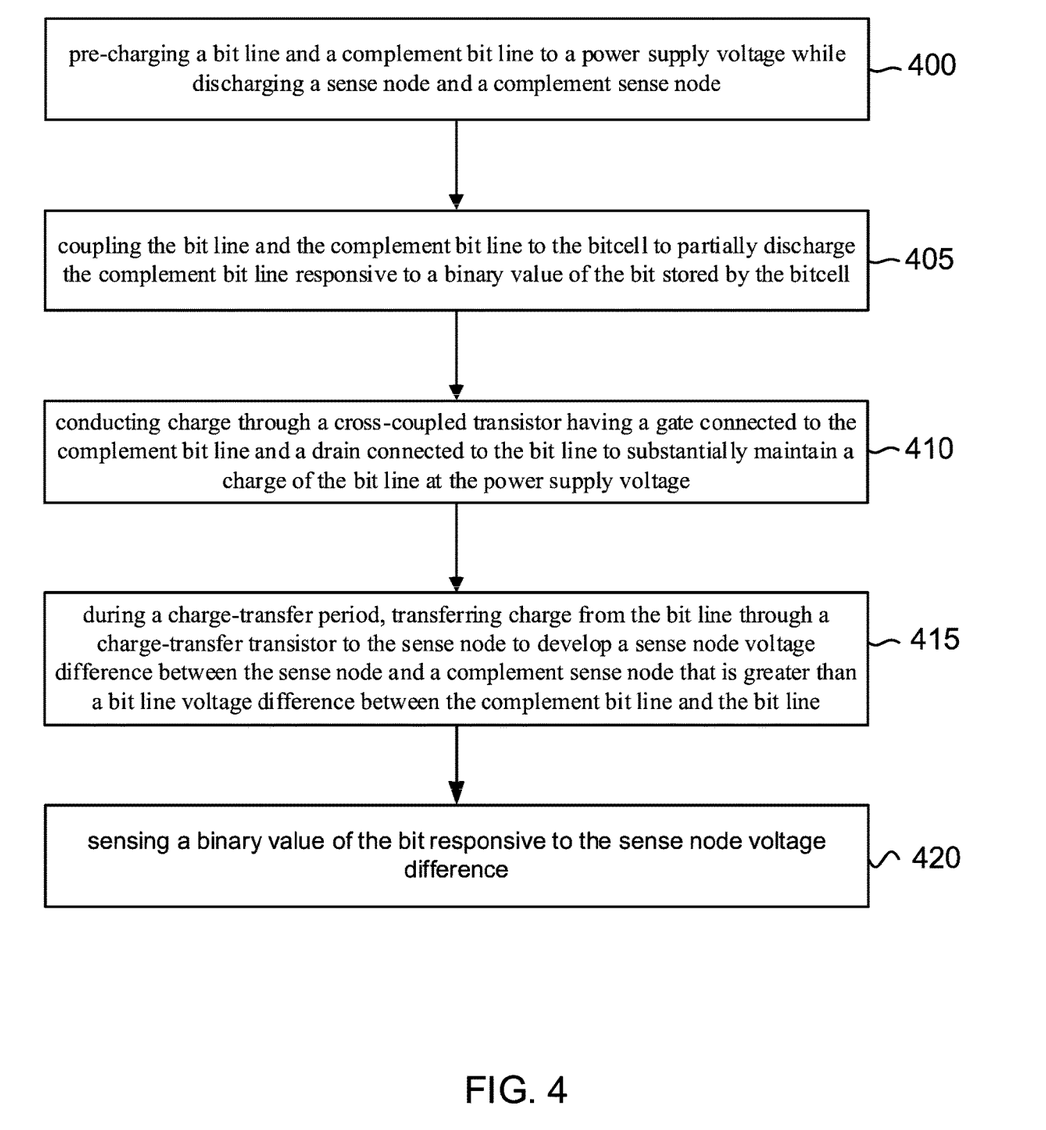
FIG. 4 is a flowchart of a bit sensing in a charge-transfer memory in accordance with an aspect of the disclosure.

A method of sensing a bit using a charge-transfer SRAM will now be discussed with regard to the flowchart of FIG. 4. The method includes an act 400 of pre-charging a bit line and a complement bit line to a power supply voltage while discharging a sense node and a complement sense node. The pre-charging of the bit lines bl and blb by pre-charge circuit 150 and the discharge of the sense nodes by transistors M1 and M2 is an example of act 400. The method further includes an act 405 of coupling the bit line and the complement bit line to the bitcell to partially discharge the complement bit line responsive to a binary value of the bit stored by the bitcell. The discharge of the complement bit line blb in SRAM 100 or 200 during the word line assertion period is an example of act 405. The method also includes an act 410 of conducting charge through a cross-coupled transistor having a gate connected to the complement bit line and a drain connected to the bit line to substantially maintain a charge of the bit line at the power supply voltage. The conduction by cross-coupled transistor P6 to maintain the charge of the bit line bl in SRAM 100 or 200 is an example of act 410. In addition, the method includes an act 415 that occurs during a charge-transfer period and includes transferring charge from the bit line through a charge-transfer transistor to the sense node to develop a sense node voltage difference between the sense node and a complement sense node that is greater than a bit line voltage difference between the complement bit line and the bit line. The conduction of charge through charge-transfer transistor P1 to charge the sense node sl is an example of act 415. Finally, the method includes an act 420 of sensing a binary value of the bit responsive to the sense node voltage difference. The latching of the sensed bit into sense amplifier 110 is an example of act 420.

Figure 5:
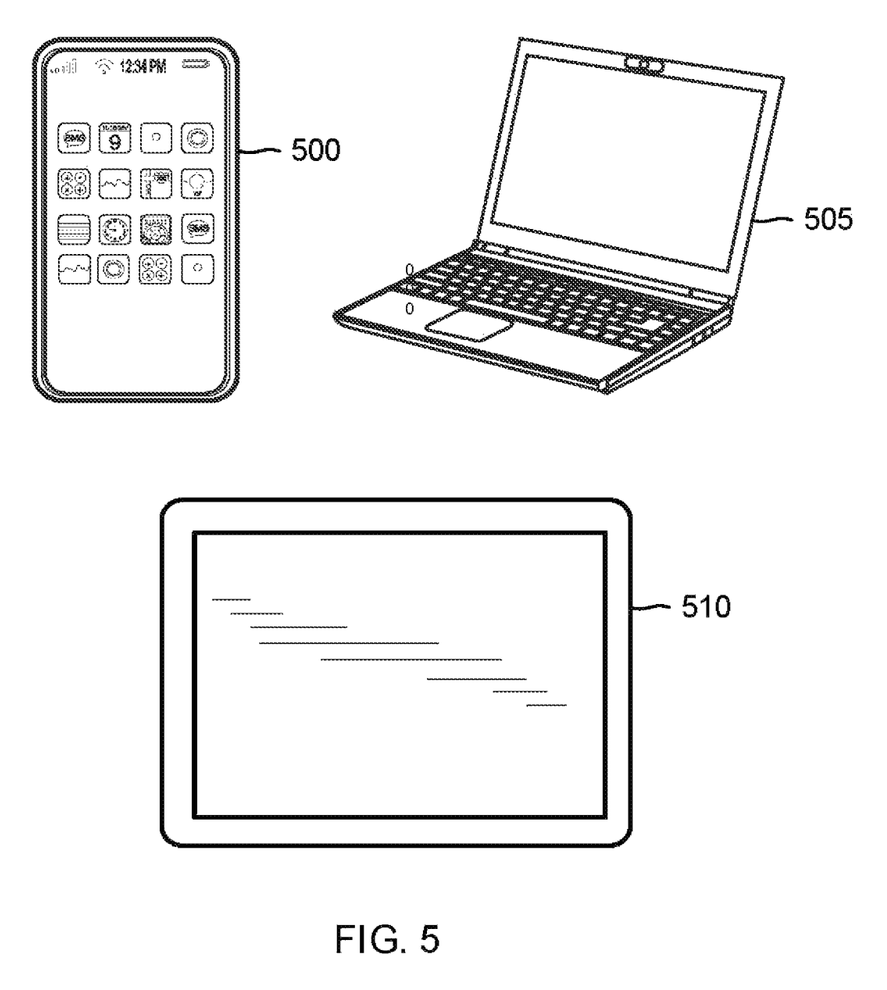
FIG. 5 illustrates some example electronic systems each incorporating an charge-transfer memory in accordance with an aspect of the disclosure.

A memory with the improved charge-transfer as disclosed herein may be incorporated into a wide variety of electronic systems. For example, as shown in FIG. 5, a cellular telephone 500, a laptop computer 505, and a tablet PC 510 may all include a memory having an improved charge-transfer function in accordance with the disclosure. Other exemplary electronic systems such as a music player, a video player, a communication device, and a personal computer may also be configured with charge-transfer memories constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A memory, comprising:
   a bit line;
   a complement bit line;
   a sense amplifier having a first logic gate cross-coupled with a second logic gate, the first logic gate having an input connected to a sense node, and the second logic gate having an input connected to a complement sense node;
   a first charge-transfer transistor connected between the bit line and the sense node;
   a second charge-transfer transistor connected between the complement bit line and the complement sense node;
   a first cross-coupled transistor having a drain connected to the bit line and a gate connected to the complement bit line;
   a second cross-coupled transistor having a drain connected to the complement bit line and a gate connected to the bit line; and
   a dummy bit line connected to a gate of the first charge-transfer transistor and connected to a gate of the second charge-transfer transistor,
   wherein the first cross-coupled transistor and the second cross-coupled transistor each comprises a PMOS cross-coupled transistor having a source connected to a power supply node, and
   wherein the first charge-transfer transistor and the second charge-transfer transistor each comprises a PMOS charge-transfer transistor.

2. The memory of claim 1, further comprising:
   a first pre-charge transistor configured to pre-charge the sense node; and
   a second pre-charge transistor configured to pre-charge the complement sense node.

3. The memory of claim 1, further comprising a pre-charge circuit configured to pre-charge the bit line and the complement bit line to a power supply voltage.

4. The memory of claim 1, further comprising:
   a bitcell including a first access transistor having a drain connected to the bit line and including a second access transistor having a drain connected to the complement bit line; and
   a word line connected to a gate of the first access transistor and to a gate of the second access transistor.

5. The memory of claim 4, wherein the first access transistor and the second access transistor each comprises an NMOS access transistor.

6. The memory of claim 1, wherein the first logic gate and the second logic gate each comprises a NAND gate.

7. The memory of claim 1, wherein the first cross-coupled transistor and the second cross-coupled transistor each comprises an NMOS cross-coupled transistor having a source connected to ground.

8. The memory of claim 7, further comprising a pre-charge circuit configured to discharge the bit line and the complement bit line to ground.

9. The memory of claim 7, wherein the first charge-transfer transistor and the second charge-transfer each comprises an NMOS charge-transfer transistor.

10. The memory of claim 9, further comprising:
    an inverter connected to a gate of the first charge-transfer transistor and connected to a gate of the second charge-transfer transistor.

11. The memory of claim 9, further comprising:
    a bitcell including a first access transistor having a drain connected to the bit line and including a second access having a drain connected to the complement bit line; and
    a word line connected to a gate of the first access transistor and to a gate of the second access transistor.

12. The memory of claim 11, wherein the first access transistor and the second access transistor each comprises an PMOS access transistor.

13. The memory of claim 9, wherein the first logic gate and the second logic gate each comprises a NOR gate.

* * * * *